United States Patent
Pierrat

(10) Patent No.: US 6,646,722 B2
(45) Date of Patent: *Nov. 11, 2003

(54) MULTIPLE IMAGE RETICLE FOR FORMING LAYERS

(75) Inventor: Christophe Pierrat, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/196,086

(22) Filed: Jul. 16, 2002

(65) Prior Publication Data

US 2002/0176065 A1 Nov. 28, 2002

Related U.S. Application Data

(60) Continuation of application No. 09/449,580, filed on Nov. 29, 1999, now Pat. No. 6,421,111, which is a continuation of application No. 09/132,830, filed on Aug. 12, 1998, now Pat. No. 5,995,200, which is a division of application No. 08/914,417, filed on Aug. 19, 1997, now Pat. No. 6,040,892.

(51) Int. Cl.$^7$ ........................ G03B 27/32; G03B 27/42; G03B 27/44; G03C 5/00
(52) U.S. Cl. ........................ 355/77; 355/53; 355/54; 430/311
(58) Field of Search .............. 355/53, 54, 55, 355/67, 77; 430/5, 20, 22, 311; 250/548

(56) References Cited

U.S. PATENT DOCUMENTS

| 3,716,296 A | 2/1973 | Springer et al. ............... 355/53 |
|---|---|---|
| 4,620,785 A | 11/1986 | Suzuki et al. ................. 355/53 |
| 4,748,478 A | 5/1988 | Suwa et al. .................... 355/53 |
| 4,758,863 A | 7/1988 | Nikkel ........................ 355/40 |
| 4,803,524 A | 2/1989 | Ohno et al. .................... 355/53 |
| 4,849,313 A | 7/1989 | Chapman et al. ............... 430/5 |
| 4,869,998 A | 9/1989 | Eccles et al. ................ 430/311 |
| 5,036,209 A | 7/1991 | Kataoka et al. .......... 250/492.2 |
| 5,049,925 A | 9/1991 | Aiton et al. .................... 355/53 |
| 5,235,626 A | 8/1993 | Flamholz et al. ............. 378/34 |
| 5,298,761 A | 3/1994 | Aoki et al. .................. 250/548 |
| 5,308,741 A | 5/1994 | Kemp ........................ 430/312 |
| 5,393,988 A | 2/1995 | Sakamoto .............. 250/492.22 |
| 5,422,491 A | 6/1995 | Sakamoto .............. 250/492.22 |
| 5,434,647 A | 7/1995 | Tanabe ........................ 355/53 |
| 5,439,764 A | 8/1995 | Alter et al. ..................... 430/5 |
| 5,451,479 A | 9/1995 | Ishibashi ..................... 430/22 |
| 5,571,641 A | 11/1996 | Martin et al. .................. 430/5 |
| 5,699,260 A | 12/1997 | Lucas et al. ........... 364/468.28 |
| 5,705,299 A | 1/1998 | Tew et al. ...................... 430/5 |
| 6,421,111 B1 * | 7/2002 | Pierrat ........................ 355/53 |

FOREIGN PATENT DOCUMENTS

| EP | 0518783 | 12/1992 |
|---|---|---|
| GB | 2190215 A | 5/1986 |
| GB | 2190215 | 11/1987 |

(List continued on next page.)

*Primary Examiner*—Henry Hung Nguyen
(74) *Attorney, Agent, or Firm*—Schwegman, Lundberg, Woessner & Kluth, P.A.

(57) ABSTRACT

A multi-image reticle used to form integrated circuitry comprises a two dimensional array of spaced images arranged in a matrix of controllably spaced rows and columns of images on a single reticle. No rotation of the reticle is required to expose various levels of circuitry on a semiconductor wafer. The wafer is held in a stepper device, which controllably positions the wafer under the desired image of the mask for exposure of a resist on the wafer. A movable aperture controls exposure through a selected image or mask pattern on the reticle. By controlling which image is used, and accurately positioning the wafer via the stepper, multiple images are accurately registered, leading to improvement in dimensions of circuitry and other structures formed on the wafer.

33 Claims, 2 Drawing Sheets

FOREIGN PATENT DOCUMENTS

| | | |
|---|---|---|
| JP | 55-165629 | 12/1980 |
| JP | 60221757 | 4/1986 |
| JP | 62-145730 | 6/1987 |
| JP | 01-234850 | 9/1989 |
| JP | 02-125609 | 5/1990 |
| JP | 04-212957 | 8/1992 |
| JP | 05-204131 | 8/1993 |
| JP | 07-211619 | 8/1995 |
| JP | 63-73520 | 4/1998 |

\* cited by examiner

| LEVEL | EXPOSURE | IMAGE | PROCESS RESIST |
|---|---|---|---|
| 1 | Y | 1 | N |
| 1 | Y | 2 | Y |
| 2 | Y | 3 | N |
| 2 | Y | 4 | Y |
| 3 | Y | 5 | Y |
| 4 | Y | 6 | Y |
| 5 | Y | 7 | N |
| 5 | Y | 8 | Y |
| 6 | Y | 9 | Y |

FIG. 3

MULTIPLE IMAGE RETICLE FOR FORMING LAYERS

RELATED APPLICATIONS

This application is a Continuation of Ser. No. 09/449,580, filed Nov. 29, 1999 now, U.S. Pat. No. 6,421,111, issued Jul. 16, 2002 which is a continuation of Ser. No. 09/132,830, filed Aug. 12, 1998 now, U.S. Pat. No. 5,995,200, issued Nov. 30, 1999, which is a divisional of Ser. No. 08/914,417, filed Aug. 19, 1991, now U.S. Pat. No. 6,040,892, issued Mar. 21, 2000 which are hereby incorporated by reference.

This invention was made with government support under Contract No. MDA972-92-C-0054, awarded by Advanced Research Projects Agency (ARPA). The Government has certain rights in this invention.

TECHNICAL FIELD OF THE INVENTION

The present invention relates generally to optical lithographic techniques used in the formation of integrated circuits and structures on a wafer. In particular, the present invention relates to a reticle having multiple exposure patterns and its use.

BACKGROUND OF THE INVENTION

Lithographic methods use multiple images or masks to expose patterns in a resist layer on a semiconductor wafer for the formation of integrated circuits and structures such as processors, ASICS and Dynamic Random Access Memory (DRAM). As manufacturing requirements call for exposure of patterns with smaller and smaller dimensions, it is becoming necessary to employ techniques which permit enhancement of the current performance of the process of photolithography. Multiple successive steps of photolithography, film growth, deposition and implantation of impurities create a complete integrated circuit with many identical copies on the same wafer. Each copy is known as a die.

As integrated circuits have become smaller in dimensions, the photo lithographic process requires more sophistication in alignment techniques and resolution. Presently, photo lithographic processes utilize an instrument referred to as a stepper which moves and aligns the wafer based on alignment marks on a reticle containing an image or mask such that desired patterns on the wafer are exposed based on the image. The reticle contains one or more images which may be referred to as levels because each image is used to form a level on the wafer. Light of a desired wavelength is either projected through or reflected by a selected image from the reticle to expose the substrate. Phase shifting methods, and electron beams, x-rays and ion beams are also used to pattern wafers.

Initially, each reticle contained only one image for forming one level. Reticles were becoming expensive to make due to the exacting conditions required to form smaller and smaller image lines. At the same time, complex integrated circuits required more and more levels and hence a high number of reticles were required to form them. The cost of the reticles required to form the circuits was becoming great. This trend is continuing as chip densities continue to increase.

One proposed solution to this problem is described in U.S. Pat. No. 4,758,863 entitled Multi-Image Reticle. Multiple images were formed on a reticle that was then rotated to expose the wafer using a different image for each level of an integrated circuit formed on the wafer. While this proposed solution reduced the need to keep changing reticles, it still introduced error into the image alignment process. First, each image had to be properly placed at different angles with respect to each other on the reticle. This introduced a rotational alignment error. Error was also introduced when a reticle was not perfectly centered. Rotation of the mask then produced a radial registration error. In addition, the angle of rotation of the mask holder introduced a further rotational alignment error. These errors made it difficult to properly align each reticle based on alignment images through the use of microscopes and other automatic alignment systems. To overcome rotational errors, a further degree of freedom than just movement in the x and y direction was required.

One further problem with this solution is that it left much space unused on the mask. Up to four images are shown on a reticle. There is wasted space, and a practical limit of about four square images which can be used. If more than four square images are used, they must be located further from the center of the reticle to fit within a slice of the reticle. This would further waste space on the reticle.

There is a need reduce the alignment error inherent in the use of multiple images on a reticle, and there is a further need to increase the number of images and hence reduce the cost of reticles.

SUMMARY OF THE INVENTION

A multi-image reticle comprises a two dimensional array of spaced images or mask patterns arranged in a matrix of controllably spaced rows and columns on a single reticle. The images are aligned consistently in the same direction such that no rotation of the reticle is required to expose the levels on a wafer. The wafer is located on a stepper, which controllably positions the wafer under the desired image of the mask for exposure of a resist on the wafer. In one embodiment, X and Y controlled opaque blades or shutters are used to define a movable aperture to allow exposure to occur only through a selected image on the reticle. In a further embodiment, a focussing device is moved to control which image is used. By controlling which image is used, and accurately positioning the wafer via the stepper, multiple images are accurately and repeatably registered, leading to improvement in dimensions of circuitry and other structures formed on the wafer.

In one embodiment, the images are designed for use with a phase shifting reflective and/or refractive mask. In this embodiment, radiation is reflected by each multi layer image to take advantage of interference patterns which are controlled to obtain desired exposure of the resist. Near the boundaries of exposed resist corresponding to the edge of the images on the reticle, the exposure received may be near zero. This can lead to undesired lines being "printed." To prevent the printing of such undesired lines, a second image on the reticle, either adjacent to the first, or placed anywhere else on the reticle is positioned to expose a second pattern over the first exposure to remove such lines prior to processing of the resist. Since no additional alignment errors are introduced, excellent registration with the previous exposure is obtained. Further images may also be aligned and exposed prior to processing the resist if desired.

Reticle costs are reduced because nine or more image patterns are located on the same reticle. Misregistration is reduced due to the ability of the stepper to position the target under the correct image using global x and y degrees of freedom without introducing errors through rotation of the reticle or having to load and accurately register a new mask. Optimal use of reticle space is made by use of an array of optimally laid out multi size rectangular images allowing a great reduction in the number of reticles and hence cost and time required to manufacture them. This can be a significant cost savings with respect to the manufacture of complex devices such as memory arrays, ASICs, processors and other integrated circuits.

The invention is particularly useful where multiple exposures are used prior to processing a resist to strip away desired areas. Since the level spacing is tightly controlled, and no unload and load of a new mask is required, registration of the two exposures is extremely consistent. Many different types of lithography may be used, including photolithography using either reflective or refractive photomasks, electron beam lithography, x-ray lithography and ion beam lithography to name a few.

BRIEF DESCRIPTION OF THE DRAWINGS

FIG. 3 is a table of images on the reticle of FIG. 1 used to form each layer on a semiconductor wafer.

DETAILED DESCRIPTION OF THE INVENTION

In the following detailed description of the preferred embodiment, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense, and the scope of the present invention is defined by the appended claims.

In the process of forming a pattern by use of photolithography, it is customary that a member used to pattern one integrated circuit on a semiconductor wafer is termed a reticle, and a member for exposing the entire wafer is termed a mask; or a member corresponding to an original sheet is termed a reticle, and a member obtained by duplicating such a reticle is termed a mask. In the present invention, a device for holding multiple such masks and reticles classified by such various definitions is referred to as a reticle for convenience. The terms image and mask pattern are used to refer to a structure on the reticle that is used to modify radiation such that it modifies a radiation sensitive material called a resist on a semiconductor wafer in a desired manner. It may do so by reflection, refraction or a combination of both. The radiation may be in the any range of the electromagnetic spectrum suitable for modifying the resist. The modification of the radiation also comprises phase shifting methods to obtain suitable interference patterns.

Figure 1:
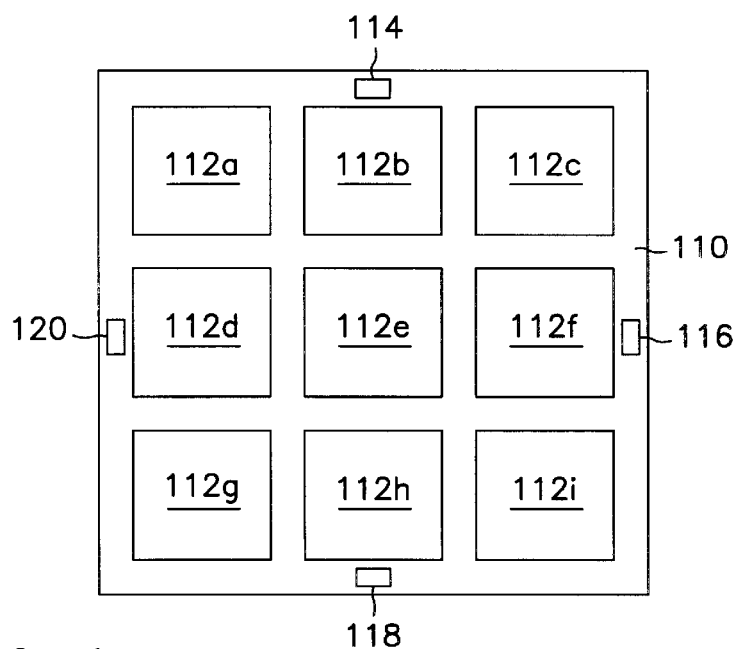
FIG. 1 is a plan view of one embodiment of a multi-image reticle.

With reference to FIG. 1, a multi-image reticle 10 comprises a transparent substrate which is generally planar and essentially free of defects on the surfaces, as well as internally, and should have high optical transmission or reflection at a desired resist exposure wavelength. Several types of glasses have been used for making reticles, including: soda-lime glass, borosilicate glass, and quartz. However, quartz is the type of glass used in this embodiment. Other materials compatible with the resist process are acceptable, particularly when a material has favorable transmissivity characteristics when the wavelength of the exposure light source is less than 180 nm.

After the reticle 10 has been polished, cleaned and inspected, it is ready to be coated by reflective materials to form multiple integrated circuit mask patterns or images 112a, 112b, 112c, 112d, 112e, 112f, 112g, 112h, and 112i which are spaced in rows and columns in a rectangular array. There are nine such images shown in FIG. 1. The nine images are arranged in three rows and three columns having substantially equal spacing between each image in each row and between each image in each column. It should be noted that the number of such images on the reticle may be varied to include fewer or thirty or more images depending on the physical limitations mandated by equipment and design rules for forming semiconductor circuitry. The spacing of such images may also be varied by the designer, but should be consistent with control parameters of a stepper described below. The reflective materials have refractive indices and absorption coefficients which determine a reflectivity and phase shift provided. In a phase shifting reflective photomask, radiation is reflected by the images such that constructive and destructive interference takes place favorably to form a highly resolved pattern on a desired surface. In a refractive or transmittive photo mask as described with reference to FIG. 2, radiation is transmitted through the reticle to expose a photo resist in a desired pattern on a semiconductor wafer. It should be noted that reticles containing images suitable for many kinds of lithographic processes, including photolithography using either reflective and refractive photomasks, electron beam lithography, x-ray lithography and ion beam lithography to name a few, may also be used without departing from the scope of the present invention.

A plurality of alignment images 114, 116, 118 and 120 are also provided on the periphery of reticle 110. These images are used in a known manner to provide for registration of the reticle and images projected on a wafer such that the images projected are properly aligned with previously formed structures on the wafer. They may be placed in various positions to ensure proper alignment of the reticle and registration of the images.

Figure 2:
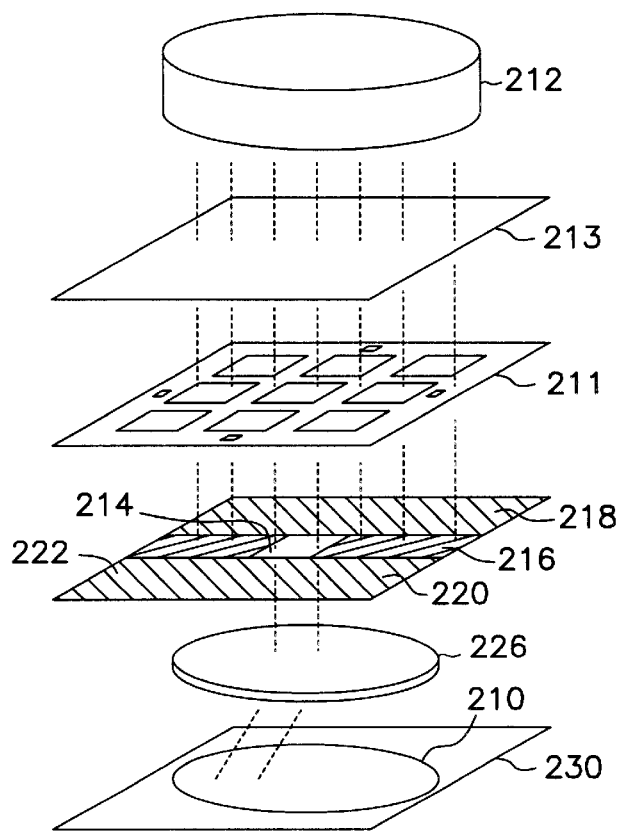
FIG. 2 is an elevational block diagram view illustrating the use of the multi-image reticle.

Each of the images in a reticle 211 comprise suitable patterns for forming circuitry on a suitably prepared substrate of a semiconductor wafer as shown at 210 in FIG. 2 using well known lithography techniques employing a resist which is conventionally applied to the wafer as desired. The resist is exposed using radiation controlled by selected images on the reticle, then processed to remove the exposed areas which are processed using conventional film growth, deposition, implantation and other techniques. Then, the remainder of the resist is usually removed and then reapplied prior to the next exposure cycle.

A conventional controlled radiation source 212 such as a lamp, selectively projects radiation, first through a condenser 213, through the reticle 211 and then through an aperture 214 provided by conventional aperture blades 216, 218, 220 and 222. The aperture blades are movable as desired to cause the radiation from a single desired image on reticle 211 at any one time to pass. While shown in an exploded block diagram form, it is recognized that the aperture blades are much closer to the reticle 211 than shown. The radiation passing through the aperture is focussed by projection optics 226 onto the wafer 210. Wafer 210 is coupled to a conventional stepper 230 to provide exposure of a resist in a controlled manner. Wafer 210 comprises conventional semiconductor wafers of any size and material. In one embodiment, a silicon wafer of between 5 and 12 inches is used.

Since many identical circuits are formed on wafer 210, stepper 230 is used to step the radiation pattern through each of the separate circuits, referred to as die. When they are fully formed, each die will be cut and encapsulated to form an integrated circuit chip. The stepper 230 is a very precise instrument which can repeatably step from die to die once the initial image is properly registered. Since the reticle contains multiple images, it need only be aligned precisely once in a reticle holder of the stepper in order to be positioned correctly relative to the wafer. It is then used to help form multiple layers of circuitry. Thereafter, the moveable aperture 214 and stepper 230 are used to control which image is projected, and where it is projected. It is an easy matter to control the spacing of the images on the reticle when making the reticle to ensure that registration of images on the wafer is maintained by the stepper once initially registered. Misregistration is reduced due to the ability of the stepper to position the target under the correct image using global x and y degrees of freedom, without introducing errors through rotation of the reticle or having to load and accurately register a new mask. Optimal use of reticle space is made by use of a rectangular array of rectangular images consistently aligned in the same direction allowing a great reduction in the number of reticles and hence cost and time required to manufacture them. The blades 214, 216, 218, and 220 need only be moved back and forth to move the aperture to allow light to project onto the correct image. No rotation of the reticle is required. The reticle may also be moved in the x and y direction in order to position images to make use of desired lens 226 characteristics. The use of multiple images on a single reticle can be a significant cost savings with respect to the manufacture of complex devices such as memory arrays, ASICs, processors and other integrated circuits.

In a further embodiment, images may be of different sizes and shapes as shown in the reticle 211 of FIG. 2. This permits optimal use of space on the reticle by allowing placement of images as desired. Since images are usually rectangular in shape, their edges line up nicely with little space between them. This is highly contrasted with the prior art method requiring rotation of the reticle to use different images. Each such image must fit within a pie shape, which inherently leads to inefficient utilization of reticle space. Larger images must be located further from the center of the reticle in order to fit within the pie shape. They still must line up with the circuit being formed when correctly rotated.

In one embodiment, each image on the reticle of the present invention is used to help form one level of circuitry or structure. Up to nine different levels may be formed using the reticle shown in FIG. 1. With more images on the reticle, even higher numbers of levels may be formed. This provides a great savings in the cost of forming circuitry, as the cost of each reticle can be a significant part of the cost of manufacturing the circuitry. Some circuitry can require more than 20 different levels to form. By greatly reducing the number of reticles required, significant cost savings are obtained. It can also take significant time to form each reticle. The reduction in the number of reticles thus saves significant time.

One further benefit of the present invention is the ability to perform multiple exposures prior to processing the resist. This is very useful in embodiments which use phase shift based lithography. In such embodiments, radiation is reflected by each multi layer image to take advantage of interference patterns which are controlled to obtain desired exposure of the resist. Near the boundaries of exposed resist corresponding to the edge of the images on the reticle, the exposure received may be near zero. This can lead to undesired lines being "printed." To prevent the printing of such undesired lines, a second image on the reticle, either adjacent to the first, or placed anywhere else on the reticle is positioned to expose a second pattern over the first exposure to remove such lines prior to processing of the resist. Since no additional alignment errors are introduced, excellent registration with the previous exposure is obtained. Further images may also be aligned and exposed prior to processing the resist if desired. FIG. 3 illustrates the use of multiple exposures using a nine image reticle to form six levels. The first level is exposed using both the first and second images prior to processing of the resist. The second level is exposed using the third and fourth images prior to processing the resist. The third and fourth levels are exposed using the fifth and sixth images respectively with the resist being processed each time. Level five also is exposed to two images, seven and eight, prior to resist processing, while level six is only exposed using image nine.

While the invention has been described with respect to particular embodiments, it will be recognized by those skilled in the art that other embodiments may also be used with the present invention. The number of images per reticle, and their shape and spacing may be varied without departing from the scope of the present invention. Further, different frequencies of radiation may also be used with suitable resists.

What is claimed is:

1. A method of forming a die for a single integrated circuit on a substrate, comprising:
    fabricating a reticle;
    positioning a plurality of integrated-circuit mask patterns in different areas of the reticle, at least some of the mask patterns representing different entire layers of the single integrated circuit;
    projecting radiation onto a first of the mask patterns to expose the die with a first of the masks on the reticle;
    moving at least one of the die and the reticle relative to each other in a straight line without rotation;
    projecting radiation onto a second of the mask patterns to expose the same die with a second of the mask patterns on the reticle;
    fabricating at least one circuit layer on the substrate.

2. The method of claim 1 where fabricating the one circuit layer includes applying to the substrate a resist having a property that can be modified by the radiation.

3. The method of claim 2 where the radiation lies in a range of the electromagnetic spectrum for modifying the resist.

4. The method of claim 1 further comprising aligning the reticle with respect to the wafer.

5. The method of claim 4 where the reticle contains at least one alignment indicium.

6. A method of forming a die for a single integrated circuit on a substrate, comprising:
    fabricating a reticle;
    positioning a plurality of integrated-circuit mask patterns in different areas of the reticle,
    projecting radiation onto a first of the mask patterns to expose the entire area of the die with a first of the mask patterns on the reticle;
    processing the substrate in response to the first of the mask patterns;

after processing, moving at least one of the die and the reticle relative to each other in a straight line without rotation;

projecting radiation onto a second of the mask patterns to expose the entire area of the same die with a second of the mask patterns on the reticle.

7. The method of claim 6 where projecting radiation through the first of the mask patterns forms circuit lines in the integrated circuit, and projecting radiation through the second of the mask patterns removes certain of the circuit lines in the integrated circuit.

8. The method of claim 6 where the circuit lines occur near an edge of the first of the mask patterns.

9. The method of claim 6 where the mask patterns are phase-shifting patterns in the group consisting of reflective and refractive masks.

10. The method of claim 6 further comprising aligning the reticle with respect to the wafer.

11. A method of forming a die for a single integrated circuit on a substrate, comprising:

fabricating a reticle having a plurality of integrated-circuit mask patterns in different areas;

projecting radiation onto a first of the mask patterns to expose the entire area of the die with a first of the mask patterns on the reticle;

processing the substrate in response to the first of the mask patterns;

after processing, moving at least one of the die and the reticle relative to each other in a straight line without rotation;

projecting radiation onto a second of the mask patterns to expose the entire area of the same die with a different one of the mask patterns on the reticle.

12. The method of claim 11 where the mask patterns are phase-shifting patterns in the group consisting of reflective and refractive masks.

13. The method of claim 11 further comprising aligning the reticle with respect to the wafer.

14. A method of forming a die for a single integrated circuit on a substrate, comprising:

fabricating a reticle having in different areas thereof a plurality of integrated-circuit mask patterns oriented in the same direction;

projecting radiation onto a first of the mask patterns to expose the entire area of the die with a first of the mask patterns on the reticle;

processing the substrate in response to the first of the mask patterns;

after processing, moving at least one of the die and the reticle relative to each other in one of two mutually orthogonal directions without rotation;

projecting radiation onto a second of the mask patterns to expose the entire area of the same die with a different one of the mask patterns on the reticle.

15. The method of claim 14 where the mask patterns are phase-shifting patterns in the group consisting of reflective and refractive masks.

16. The method of claim 14 further comprising aligning the reticle with respect to the wafer.

17. A method of forming a die for a single integrated circuit on a substrate, comprising:

fabricating a reticle;

positioning a plurality of integrated-circuit mask patterns in different areas of the reticle;

projecting radiation onto a first of the mask patterns to expose the entire area of the die with a first of the mask patterns on the reticle;

processing the substrate in response to the first of the mask patterns;

after processing, moving at least one of the die and the reticle relative to each other in one of two directions without rotation;

projecting radiation onto a second of the mask patterns to expose the entire area of the same die with a different one of the mask patterns on the reticle.

18. The method of claim 17 where the two directions are mutually orthogonal.

19. A method of fabricating integrated circuits on a substrate, comprising:

fabricating a reticle containing in different areas thereof a plurality of mask patterns for a die representing one of the integrated circuits;

projecting radiation onto a first of the mask patterns to expose the entire area of the die with a first of the mask patterns on the reticle;

processing the substrate in response to the first of the mask patterns;

after processing, moving at least one of the die and the reticle relative to each other in a straight line without rotation;

projecting radiation onto a second of the mask patterns to expose the entire area of the same die with a different one of the mask patterns on the reticle.

20. The method of claim 19 where projecting radiation through the first of the mask patterns forms circuit lines in the integrated circuit, and projecting radiation through the second of the mask patterns removes certain of the circuit lines in the integrated circuit.

21. The method of claim 19 where the circuit lines occur near an edge of the first mask image.

22. The method of claim 19 where the mask patterns are phase-shifting patterns in the group consisting of reflective and refractive masks.

23. The method of claim 19 further comprising aligning the reticle with respect to the wafer.

24. A method of fabricating integrated circuits on a substrate, comprising:

fabricating a reticle containing in different areas thereof a plurality of mask patterns, at least some of the mask patterns representing multiple entire layers of a die for one of the integrated circuits;

projecting radiation onto a first of the mask patterns to expose the die with a first of the mask patterns on the reticle;

effecting relative motion between the die and the mask patterns in the reticle in a straight line without rotation;

projecting radiation onto a second of the mask patterns to expose the same die with a different one of the mask patterns on the reticle;

processing the substrate between exposing the first and the second of the mask patterns.

25. The method of claim 24 where the relative motion is effected by moving the substrate.

26. The method of claim 24 where the relative motion is effected by moving the reticle.

27. The method of claim 24 where the relative motion is effected by moving one or more aperture blades or shutters.

28. The method of claim 27 where the relative motion is effected without moving either the substrate or the reticle.

29. A method of forming a die for a single integrated circuit on a substrate, comprising:

fabricating a reticle;

positioning a plurality of integrated-circuit mask patterns in different areas of the reticle, at least some of the mask patterns representing different entire layers of the single integrated circuit;

projecting radiation onto a first of the mask patterns to expose the die with a first of the mask patterns on the reticle;

effecting relative motion between the die and the mask patterns in the reticle in a straight line without rotation;

projecting radiation onto a second of the mask patterns to expose the same die with a second of the mask patterns on the reticle;

processing the substrate between exposing the first and the second mask patterns.

30. The method of claim 29 where the relative motion is effected by moving the substrate.

31. The method of claim 29 where the relative motion is effected by moving the reticle.

32. The method of claim 29 where the relative motion is effected by moving one or more blades or shutters.

33. The method of claim 32 where the relative motion is effected without moving either the substrate or the reticle.

* * * * *

UNITED STATES PATENT AND TRADEMARK OFFICE
CERTIFICATE OF CORRECTION

PATENT NO.    : 6,646,722 B2
DATED         : November 11, 2003
INVENTOR(S)   : Pierrat It is certified that error appears in the above-identified patent and that said Letters Patent is hereby corrected as shown below:

<u>Title page,</u>
Item [56], References Cited, U.S. PATENT DOCUMENTS, below "5,705,299", insert
-- 5,571,643           11/05/1996         Bae            430/5 --.

Signed and Sealed this

Twenty-eighth Day of June, 2005

JON W. DUDAS
*Director of the United States Patent and Trademark Office*